United States Patent [19]

Danby et al.

[11] Patent Number: 4,975,411
[45] Date of Patent: Dec. 4, 1990

[54] SUPERCONDUCTORS AND METHODS OF MAKING SAME

[75] Inventors: Gordon T. Danby, Wading River; Charles E. Brukl, Ft. Salonga; Lawrence A. Minkoff, Merrick, all of N.Y.

[73] Assignee: Fonar Corporation, Melville, N.Y.

[21] Appl. No.: 52,582

[22] Filed: May 19, 1987

[51] Int. Cl.$^5$ .................... H01L 39/12; H01F 1/10
[52] U.S. Cl. .................... 505/1; 148/103; 148/108; 148/301; 148/303; 252/62.63; 252/518; 252/521; 264/24; 419/20; 419/22
[58] Field of Search .................... 252/62.63, 518, 521; 148/103, 108, 301, 303; 264/22, 24, 108; 505/803, 1, 727; 204/155; 419/1, 20, 22, 66

[56] References Cited

U.S. PATENT DOCUMENTS

| | | | |
|---|---|---|---|
| 3,596,350 | 8/1971 | Steingroever et al. | 252/62.63 |
| 3,615,915 | 10/1971 | Luiten et al. | 148/103 |
| 3,626,273 | 7/1972 | Graves | 161/3 |
| 3,884,823 | 5/1975 | Clendenen et al. | 252/62.63 |
| 4,222,814 | 9/1980 | Reitz | 148/108 |
| 4,397,796 | 8/1983 | Lotgering et al. | 252/62.63 |
| 4,536,230 | 8/1985 | Landa et al. | 148/301 |
| 4,678,634 | 7/1987 | Tawara et al. | 148/103 |

OTHER PUBLICATIONS

Yang et al., *Proceedings of Symposium S, 1987 Spring Meeting of the MRS (Extended Abstracts High Temperature Superconductors)*, Pittsburgh, Pa., 4/87, pp. 77–79.

Ku et al., Proceedings of Symposium S, 1987 Spring Meeting of the MRS (Extended Abstracts High Temperature Superconductors), Pittsburgh, Pa., 4/87, pp. 177–179.

Aikada et al., *Japanese Journal of Applied Physics*, vol. 26, No. 4, Apr. 1987, pp. 1377–1379.

Iwazumi et al., *Japanese Journal of Applied Physics*, vol. 26, No. 4, Apr. 1987, pp. 1386–1387.

Hikada et al., *Japanese Journal of Applied Physics*, vol. 26, No. 5, May 1987, pp. 2726–2728.

Robinson, A. L., *Science* (Research News), Jun. 5, 1987, p. 1189.

Dinger et al., *Physical Renew Letters*, vol. 58, No. 25, Jun. 1987, pp. 2687–2690.

Suzuki et al., *Japanese Journal Applied Physics*, vol. 26, No. 4, Apr. 1987, pp. 2524–2525.

Ekin, J. W. et al., J. Appl. Phys., Dec. 15, 1987.

R. J. Cava, R. B. van Dover, B. Batlogg, and E. A. Rietman, "Bulk Superconductivity at 36 K in $La_{1.8}Sr_{0.2}CuO_4$," Physical Review Letters, Jan. 26, 1987: pp. 408–410.

C. W. Chu, P. H. Hor, R. L. Meng, L. Gao, Z. J. Huang, and Y. Q. Wang, "Evidence of Superconductivity above 40 K in the La–Ba–Cu–O Compound System", Physical Review Letters, Jan. 26, 1987: pp. 405–407.

I. Iguchi, H. Watanabe, Y. Kasai, T. Mochiku, A. Sugishita, S. Narumi, and E. Yamaka, "Superconductivity of Y–Ba–Cu–O Compound Above Liquid Nitrogen Temperature", Japanese Journal of Applied Physics, Apr., 1987: pp. L327–L331.

A. Matsushita, T. Hatano, T. Matsumoto, H. Aoki, Y. Asada, K. Nakamura, K. Honda, T. Oguchi, and K. Ogawa, "High–$T_c$ Superconductor $Ba_{0.5}Y_{0.5}Cu_1O_x$," Japanese Journal of Applied Physics: pp. L332–L333.

K. Kitazawa, K. Kishio, H. Takagi, T. Hasegawa, S. Kanbe, S. Uchida, S. Tanaka, and K. Fueki, "Superconductivity at 95 K in the New Yb–Ba–Cu Oxide System", Japanese Journal of Applied Physics, Apr., 1987: pp. L339–L341.

S. Hikami, S. Kagoshima, S. Komiyama, T. Hirai, H. Minami, and T. Masumi, "High $T_c$ Magnetic Superconductor: Ho–Ba–Cu Oxide", Japanese Journal of Applied Physics, Apr., 1987: pp. L347–L348.

*Primary Examiner*—Paul Lieberman
*Assistant Examiner*—Linda Skaling
*Attorney, Agent, or Firm*—Lerner, David, Littenberg, Krumholz & Mentlik

[57] ABSTRACT

A ceramic superconductor is made by consolidating a plurality of metals and a chalcogen and applying a magnetic field during the consolidation operation.

14 Claims, No Drawings

SUPERCONDUCTORS AND METHODS OF MAKING SAME

BACKGROUND OF THE INVENTION

The present invention relates to superconductors, particularly ceramic superconductors and to processes for making same.

The term "ceramic superconductor" has been coined recently to describe new superconducting materials which offer the promise of superconductivity at higher temperatures than previously thought attainable. In particular, many of the ceramic superconducting materials announced by various researchers throughout the world during the early months of 1987 superconduct at temperatures equal to or greater than that of boiling liquid nitrogen at atmospheric pressure. As used in this disclosure, the term "ceramic superconductor" means a material which exhibits superconductivity at some temperature and which incorporates a plurality of metals together with a chalcogen. By far, the majority of ceramic superconductors incorporate oxygen in conjunction with three or more metals, typically including copper, a Group II metal selected from the group consisting of calcium, strontium, barium and mixtures thereof, and a transition metal selected from the group consisting of Sc, Y, La, the other lanthanides which include Ce, Pr, Nd, Pm, Sm, Eu, Gd, Tb, Dy, Ho, Er, Tm, Yb, and Lu, and mixtures of these elements. Among the most promising ceramic superconductors are the "1, 2, 3" superconductors incorporating the transition metal, Group II metal and copper in molar ratios of 1:2:3 and also including oxygen. Other known ceramic superconductors are listed hereinbelow.

Superconductors such as ceramic superconductors most typically have been made heretofore by processes involving consolidation. In one such process, mixed metallic-oxide particles including the various metallic constituents of the final superconductor in conjunction with oxygen are consolidated by subjecting the particles to a final pressing step followed by a final sintering step. Ordinarily, the oxygen content of the material is adjusted during the final sintering step, as by adjusting the temperature and/or oxygen content of the surrounding atmosphere so as to change the equilibrium oxygen content of the material. The mixed metallic oxide particles employed in the final pressing and sintering steps typically are formed in preliminary steps which provide for mixing of the various metals included in the starting materials. Thus, the process may start with substantially pure compounds of the individual metals to be incorporated in the final superconductor, in finely divided, particulate form. These pure compounds may be intimately mixed and sintered in one or more preliminary steps. The resulting intermediate material may then be pulverized, remixed and resintered. This process may be repeated so as to progressively intermix the various metallic elements by interdiffusion prior to the final consolidation steps.

Other processes employed heretofore involve consolidation of a solid superconductor from a vapor or liquid phase containing the constituents of the superconductor rather than from particles. Thus, processes such as chemical vapor deposition, sputtering, Pfann zone melting, plasma spraying, hot pressing and isostatic hot pressing have been employed to form superconductors.

The manifest commercial potential of superconductors useful at relatively high temperatures has spurred what may fairly be characterized as an unprecedented research effort involving many of the physicists and material scientists in the world. However, apart from the fundamental discovery of to the existence of ceramic superconductors, much of the work done to date has focused on characterization of known ceramic superconducting materials or minor modifications of known materials.

SUMMARY OF THE INVENTION

According to the present invention the superconducting properties of a magnetically anisotropic superconductor, preferably a ceramic superconductor, can be materially enhanced by subjecting the constituents of the superconductor to a magnetic field during consolidation of the superconductor. According to preferred aspects of the present invention, fine particles containing oxides of the various metals which will ultimately constitute the superconductor are subjected to a magnetic field during a final pressing operation immediately preceding a final sintering step of the manufacturing process. Although the present invention is not limited by any theory of operation, it is believed that the enhanced superconducting properties achieved according to these aspects of the present invention may arise from orientation of crystal structures within the final, consolidated material by a process similar to the orientation of crystal structures in a ceramic permanent magnet by a "prealignment" magnetic field during the pressing step prior to final sintering of such a magnet.

Regardless of the theory or principle of operation, application of a magnetic field during consolidation, and preferably during a final pressing step immediately preceding a final sintering step provides a ceramic superconducting material with enhanced superconducting properties. The present invention thus provides both improved methods of making superconducting materials and improved superconducting materials.

DETAILED DESCRIPTION OF THE PREFERRED EMBODIMENTS

In one process according to the present invention, a transition metal oxide, a Group II metal carbonate and cupric oxide (CuO), each of about 99.99% purity or better and each of about 1 micron particle size are weighed to give a mixture containing the transition metal, Group II metal and copper in molar ratios of 1(transition metal):2(Group II metal):3(copper). These substantially pure oxides and carbonate are mixed and the resulting mixture is heated in a quartz or aluminum crucible within a conventional tube furnace at an elevated temperature, preferably between about 900° C. and about 970° C., most preferably about 950° C. under flowing $O_2$ at ambient pressure. During this step, the Group II metal carbonate calcines to the corresponding oxide, and there is some blending of the various metal oxides by interdiffusion. After maintaining the mixed oxides under these preliminary sintering conditions for a first dwell period, typically about 16–32 hours and, most preferably, about 24 hours, the material is cooled slowly within the furnace and then pulverized to approximately one micron particle size. The pulverized material is then loaded into a conventional nonmagnetic stainless steel ram and die, and compacted under a pressure which may be selected from a very broad range; from about 70 to about 4100 Kg/cm$^2$ or more, as for example about 915 Kg/cm$^2$. The compacted particles are then sintered once again under $O_2$ at ambient pressure and at about 900-970° C. for about 16-32 hours followed by a further cooling step over a period of about 6 hours. The resulting mass is pulverized once again, to about 1 micron-6 micron mean particle size and more preferably about 1 micron-3 micron mean particle size. This particulate material includes a substantial proportion of individual particles incorporating all of the three metals included in the starting materials. Such mixed particles result from interdiffusion during the preceding preliminary sintering steps. Thus, the distribution of the metals in these particles approximates the distribution in the final superconductor to be made. These mixed particles also include oxygen. These particles are then consolidated by means of a final pressing step and a final sintering step.

In the final pressing step the particles are once again compacted in the same punch and die, and at the same pressures, as used in the prior compaction step. During this final pressing step, however, a magnetic field is applied to the particles simultaneously with the compacting pressure. Most preferably, the punch and die are nonmagnetic stainless steel, and the magnetic field is applied by an external electromagnet. Desirably, the magnetic field is a field of substantially uniform strength and direction throughout the powder mass undergoing compaction. Preferably, the magnetic field direction is perpendicular to the direction of the applied pressure. Desirably, the magnetic field has a strength of at least about 8,000 Gauss, and most preferably, at least about 25,000 Gauss. Still greater magnetic fields can be employed. Preferably the mean particle size of the particulate material employed in the final compaction step is not greater than the size of a magnetic domain within the material. Thus, each particle most preferably consists of a single magnetic domain. Although the present invention is not limited by any theory of operation, it is believed that such single domain particles are most susceptible to alignment by the magnetic field, and hence provide the most effective alignment of crystal structures in the final product.

If desired, the powdered material can be provided with a fugitive lubricant prior to the final compaction and magnetic field exposure step. Waxes commonly used as lubricants in powder metallurgy may be employed for this purpose. The final pressing or compaction step may be conducted at room temperature.

The final compaction or pressing and magnetic field exposure steps are followed by a final sintering step. Where a lubricant is utilized, the final sintering step includes a preliminary heating step in an inert atmosphere such as argon or the like to evaporate any lubricant without ashing it so as to avoid carbon contamination of the superconductor. After suitable gas purging and flushing, following the typical practices employed in precision powder metallurgy to rid the furnace of residual lubricant, the early stage of the final sintering step may be conducted under substantially the same conditions as used for the prior, preliminary sintering steps. Thus, a temperature of about 900-970° C. and, preferably, about 950° C. may be maintained under an oxygen atmosphere at ambient pressure for about 16-32 hours and, most preferably, about 24 hours. After this stage, the final stage of the final sintering step is conducted so as to adjust the oxygen content of the sintered material. Thus, the oxygen content of the atmosphere and/or the temperature of the material can be adjusted to alter the equilibrium oxygen content of the material. Preferably, where the final stage of this sintering step is conducted under an atmosphere of substantially pure $O_2$ at ambient pressure, the temperature of the sample may be reduced to about 450-500° C. and, most preferably, about 455° C. over a period of about 3 hours and maintained at that temperature for about 22 hours, followed by final cooling to about 200° C. or less in the oxygen atmosphere. After the final cooling step, the material is ready for use.

Superconducting materials made according to this aspect of the present invention can be used for substantially the same purposes as the other ceramic superconductors now known in the art. Thus, they may be employed as conductors of electricity, or as Meissner-effect levitation devices.

As will be readily appreciated by those skilled in the art, the particulate materials subjected to the final compaction step with magnetic field application and the subsequent final sintering step can be made in ways other than the preliminary mixing and preliminary sintering steps described above. Merely by way of example, these particulate materials can be formed by alloying the metals desired in the final superconductor, oxidizing the alloy and pulverizing the oxidized alloy. Alternatively, the individual oxides may be melted together to form a homogenous blend which is then pulverized. Also, the preliminary sintering steps described above can be repeated a greater or lesser number of times prior to the final sintering step. However, the particulate materials subjected to the final pressing step, with application of the magnetic field, should desirably have the metals to be included in the final superconductor in intimate admixture with one another, within each particle, in conjunction with oxygen.

According to the broadest compass of the present invention, the consolidation step of the process can involve procedures other than pressing and sintering. Thus, a magnetic field may be applied during consolidation of a superconductor from the gas phase or liquid phase, as during a vapor deposition process, sputtering, Pfann zone melting, plasma spraying, hot pressing and isostatic hot pressing. Desirably, in a process involving consolidation from the liquid or gas phase, the magnetic field is applied to the constituents of the superconductor while these are solidifying, i.e., during cooling to below the solidus temperature.

A superconductor can be made using substantially any known magnetically anisotropic superconductor composition according to the present invention. It is believed that the response of particular superconductors to the magnetic field applied during consolidation relates, at least in part, to the magnetic susceptibility and magnetic anisotropy of the composition. Thus, those compositions having greater susceptibility to alignment by magnetic fields applied during consolidation, as indicated by properties of the composition such as greater magnetic susceptibility and greater magnetic anisotropy, are believed to benefit most from exposure to the magnetic field during consolidation In general, compositions including individual elements which are magnetically susceptible will have greater magnetic susceptibility. For example, holmium, dysprosium and gadolinium are among the most magnetic lanthanides. Compositions including these elements, such as the mixed Ho-Ba-Cu oxide noted in Hikami et al., Japanese Journal of Applied Physics, Vol. 26, No. 4, April, 1987, pp. L347-L348 can be utilized. Other ceramic superconducting compositions such as the aforementioned "1,2,3" compositions can also be used. Thus, compositions incorporating Y, Ba, and Cu in a 1:2:3 molar ratio may be employed. Also, other superconducting materials benefit as well, and may be used in the invention. Among the other ceramic superconducting compositions which have been described are as follows:

| Material | Reference |
| --- | --- |
| $La_{2-x}Sr_xCuO_4$ (X = 0.075 − 0.2) | Cava, R. J. et al., Physical Review Letters, Vol. 58, No. 4, p. 408 et seq., 26 January, 1987. |
| $BaPb_{(1-x)}Bi_xO_3$ | Mattheiss, L. F. et al., Physical Review Letters, B 28, 4227 (1983). |
| $La_{2-x}Ba_x CuO_4$ | Yu et al., Physical Review Letters, Vol. 58, No. 10, 9 Manam 1987, pp. 1035 et seq. |
| $(Y_{0.6}Ba_{0.4})_2Cu_1O_z$ where Z is less than or equal to 4. | Wu et al., Physical Review Letters, Vol. 58, No. 9. |
| Oxides of: $Yb_{16}Ba_1Cu_2$; $(Yb_{0.9}Ba_{0.1})_2Cu$; $Yb_6Ba_1Cu_1$; $(Yb_{0.8}La_{0.1}Ba_{0.1})_2Cu$; $[(Yb_{0.9}La_{0.1})_{0.9}(Ba_{0.9}Sr_{0.1})_{0.1}]_2Cu$; $(Lu_{0.9}Ba_{0.1})_2Cu$; $Y_{0.9}Ba_{0.1}Cu$ | Husoya et al., Japanese Journal of Applied Physics, Vol. 26, No. 4, April, 1987, pp. L325-L326 |
| $Y_{2-x}Ba_xCuO_z$ (x between 0.6 and 1.4) | Iguchi et al., Japanese Journal of Applied Physics, Vol.26, No. 4, April, 1987, pp. L327-L328 |
| $Ba_{0.5}Y_{0.5}Cu, O_x$ | Matsushita et al., Japanese Journal of Applied Physics, Vol. 26, No. 4, April, 1987, pp. L332-L333 |
| $(La_{0.85}Ln_{0.05}Sr_{0.1})_2CuBaO_4$ Ln = Pr,Nd,Sm,Eu,Gd,Tb, Dy,Ho,Er,Tm | Hasegawa et al., Japanese Journal of Applied Physics, Vol. 26, No. 4, April, 1987, pp. L337-L338 |
| $(Yb_{1-x}Ba_x)_3Cu_2O_{7-}$ | Kitazawa et al., Japanese Journal of Applied Physics, Vol. 26, No. 4, April, 1987, pp. L339-L341 |

And the following additional materials:

$Y Ba_2Cu_3O_{7-x}$ $Y_{.87}Ba_{1.53}Cu_3O_y$ $[R.E.] Ba_2Cu_3O_{9-y}$

Where R.E. symbolizes a rare earth $(LaBa)_2CuO_4$ $LaBa_2Cu_3O_{6+x}$ $YBaCu_3O_7$ $La_{2-x}Sr_xCuO_{4-y}$ $La_{2-x}(BaSr)_xCuO_4$ $La_{1-x}Ba_xCuO_4$ $La_{1-x}M_xCuO_4$; $M_x=Sr,Ba,Ca$ $La_{1-x}Ba_x(Sr_{1-x})CuO_4$ Lu-Ba-Cu-O All of which were described at the Materials Research Society meeting in Los Angeles, Calif. during the week of Apr. 19, 1987.

These materials are merely exemplary of those which may be treated in processes according to the present invention. As will be appreciated, numerous variations and combinations of the features described above can be employed without departing from the present invention. Merely by way of example, magnetically anisotropic superconductors other than the preferred ceramic superconductors can be used. Also, to the extent compatible with superconductivity, elements such as Al, Ni, Co and Fe can be substituted for Cu in the ceramic superconductor adverted to above so as to enhance the magnetic properties of the material. Further in the preferred processes involving pressing and sintering, a magnetic field may be applied during the final sintering step as well as during the final pressing step.

What is claimed is:

1. A method of making a magnetically anisotropic bulk high-temperature superconductor comprising the steps of providing particles including a plurality of metals including at least one magnetically susceptible lanthanide and an oxygen constituent in admixture with one another as the constituents of said superconductor and consolidating said constituents by compacting said particles and sintering said compacted particles, wherein the improvement comprises the step of applying a magnetic field to said particles during said consolidating step, said particles being magnetically anisotropic and magnetically susceptible during said consolidating step, said magnetic field being effective to substantially align said particles in said consolidating step.

2. A method as claimed in claim 2 wherein said magnetic field has a field strength of at least about 8,000 Gauss.

3. A method as claimed in claim 2 wherein said magnetic field has a field strength of at least about 25,000 Gauss.

4. A method as claimed in claim 1 wherein said particles have a mean particle size of about 1 micron to about 6 microns.

5. A method as claimed in claim 4 wherein said particles have a mean particle size of about 1 micron to about 3 microns.

6. A method as claimed in claim 1 wherein said particles include single-domain particles, each such single-domain particle including only one magnetic domain.

7. A method as claimed in claim 1 wherein said metals in said particles include Cu, and a Group IIA metal selected from the group consisting of Ca, Sr, Ba and mixtures thereof.

8. A method as claimed in claim 7 wherein said plurality of metals includes a first metal component including said magnetically susceptible lanthanide and an additional metal selected from the group consisting of Y, Sc, La, Ce, Pr, Nd, Pm, Sm, Eu, Gd, Tb, Dy, Ho, Er, Tm, Yb, Lu, and mixtures thereof.

9. A method as claimed in claim 8 wherein said first metal component, Group IIA metal and copper are present at a molar ratio of about 1:2:3.

10. A method as claimed in claim 1 wherein said magnetically susceptible lanthanide includes a metal selected from the group consisting of Ho, Dy, Gd and mixtures thereof.

11. A method as claimed in claim 1 further comprising the step of adjusting the oxygen content of said particles during said sintering step.

12. A method as claimed in claim 11 wherein said step of providing said particles includes the steps of providing said metals as substantially pure oxides of the individual metals in particulate form, mixing said particulate, substantially pure oxides, preliminarily sintering said mixed, pure oxides to thereby intimately mix said pure oxides with one another by diffusion, and pulverizing said intimately mixed oxides.

13. A method as claimed in claim 12 wherein said step of forming said mixed oxides further includes the step of mixing and resintering said pulverized intimately mixed oxides and pulverizing the product of said resintering step.

14. A method as claimed in claim 7 wherein said magnetically susceptible lanthanide, Group IIA metal, and copper are present at a molar ratio of about 1:2:3.

* * * * *

Adverse Decisions in Interference

Patent No. 4,975,411, Gordon T. Danby, Charles E. Brukl, Lawrence A. Minkoff, SUPERCONDUCTORS AND METHODS OF MAKING SAME, Interference No. 104,015, final judgment adverse to the patentee rendered April 22, 1999, as to claims 1-17.
*(Official Gazette June 8, 1999)*